(12) United States Patent
Goldman

(10) Patent No.: US 6,785,859 B2
(45) Date of Patent: Aug. 31, 2004

(54) INTERLEAVER FOR VARIABLE BLOCK SIZE

(75) Inventor: Haim Goldman, Herzelia (IL)

(73) Assignee: Texas Instruments Incorporated, Dallas, TX (US)

( * ) Notice: Subject to any disclaimer, the term of this patent is extended or adjusted under 35 U.S.C. 154(b) by 460 days.

(21) Appl. No.: 09/923,468

(22) Filed: Aug. 6, 2001

(65) Prior Publication Data

US 2002/0124221 A1 Sep. 5, 2002

Related U.S. Application Data

(60) Provisional application No. 60/223,252, filed on Aug. 4, 2000.

(51) Int. Cl.$^7$ .......................... H03M 13/29; H03M 13/27
(52) U.S. Cl. ...................... 714/755; 714/759; 714/774
(58) Field of Search ................................ 714/755, 759, 714/774

(56) References Cited

U.S. PATENT DOCUMENTS 6,430,722 B1 * 8/2002 Eroz et al. .................. 714/755

OTHER PUBLICATIONS

Ran, Moshe and Shahaf Wayer; Improving ECC scheme of proposals 802.16.1pc–00/14 and 802.16.1pc–00/13; Mar. 6, 2000; IEEE Broadband Wireless Access Working Group <http://ieee802.org/16>; pp. 1–15.*

Hess, Jason R.; Implementation of a Turbo Decoder on a Configurable Computing Platform; Sep. 17, 1999; Virginia Polytechnic Institute and State University (scholar.lib.vt.edu); pp. i–x and 1–74.*

Barbulescu, Sorin A. et al.; Turbo Codes 2000; Jan. 8–12, 2001; ITU—Telecommunication Standardization Sector, Study Group 15, pp. 1–20.*

* cited by examiner

Primary Examiner—R. Stephen Dildine
(74) Attorney, Agent, or Firm—Carlton H. Hoel; W. James Brady; Fredrick J. Telecky, Jr.

(57) ABSTRACT

An interleaver structure for turbo codes with variable block size. The interleaver permutes symbols through multiplication by a parameter followed by modulus by the block size. A table of the multiplication parameter as a function of the block size permits adaptability to a wide range of block sizes without significant memory consumption.

4 Claims, 2 Drawing Sheets

| SEGMENT | BLOCK SIZE | α |
|---|---|---|
| 1 | 144 ≤ K ≤ 229 | 13 |
| 2 | 230 ≤ K ≤ 325 | 17 |
| 3 | 326 ≤ K ≤ 445 | 19 |
| 4 | 446 ≤ K ≤ 685 | 23 |
| 5 | 686 ≤ K ≤ 901 | 29 |
| 6 | 902 ≤ K ≤ 1165 | 31 |
| 7 | 1166 ≤ K ≤ 1525 | 37 |
| 8 | 1526 ≤ K ≤ 1765 | 41 |
| 10 | 1766 ≤ K ≤ 2029 | 43 |
| 11 | 2030 ≤ K ≤ 2509 | 47 |
| 12 | 2510 ≤ K ≤ 3145 | 53 |
| 13 | 3146 ≤ K ≤ 3601 | 59 |
| 14 | 3602 ≤ K ≤ 4105 | 61 |
| 15 | 4106 ≤ K ≤ 4765 | 67 |
| 16 | 4766 ≤ K ≤ 5185 | 71 |
| 17 | 5186 ≤ K ≤ 5785 | 73 |
| 18 | 5786 ≤ K ≤ 6565 | 79 |
| 19 | 6566 ≤ K ≤ 8149 | 83 |
| 20 | 8150 ≤ K ≤ 9805 | 97 |
| 21 | 9806 ≤ K ≤ 10405 | 101 |
| 22 | 10406 ≤ K ≤ 11029 | 103 |
| 23 | 11030 ≤ K ≤ 11665 | 107 |
| 24 | 11666 ≤ K ≤ 12325 | 109 |
| 25 | 12326 ≤ K ≤ 14449 | 113 |
| 26 | 14450 ≤ K ≤ 16645 | 127 |
| 27 | 16646 ≤ K ≤ 17965 | 131 |
| 28 | 17966 ≤ K ≤ 19045 | 137 |
| 29 | 19046 ≤ K ≤ 20761 | 139 |
| 30 | 20762 ≤ K ≤ 22501 | 149 |
| 31 | 22502 ≤ K ≤ 23725 | 151 |
| 32 | 23726 ≤ K ≤ 25609 | 157 |
| 33 | 25610 ≤ K ≤ 27229 | 163 |
| 34 | 27230 ≤ K ≤ 28909 | 167 |
| 35 | 28910 ≤ K ≤ 30985 | 173 |
| 36 | 30986 ≤ K ≤ 32401 | 179 |
| 37 | 32402 ≤ K ≤ 34621 | 181 |
| 38 | 34622 ≤ K ≤ 36865 | 191 |
| 39 | 36866 ≤ K ≤ 38029 | 193 |
| 40 | 38030 ≤ K ≤ 39205 | 197 |
| 41 | 39206 ≤ K ≤ 42065 | 199 |
| 42 | 42062 ≤ K ≤ 47125 | 211 |
| 43 | 47126 ≤ K ≤ 50629 | 223 |
| 44 | 50630 ≤ K ≤ 51985 | 227 |
| 45 | 51986 ≤ K ≤ 53365 | 229 |
| 46 | 53366 ≤ K ≤ 55705 | 233 |
| 47 | 55706 ≤ K ≤ 57601 | 239 |
| 48 | 57602 ≤ K ≤ 60541 | 241 |
| 49 | 60542 ≤ K ≤ 64525 | 251 |
| 50 | 64525 ≤ K ≤ 65536 | 257 |

*FIG. 3*

INTERLEAVER FOR VARIABLE BLOCK SIZE

RELATED APPLICATIONS

This patent application claims priority from provisional patent application serial No. 60/223,252, filed Aug. 04, 2000.

BACKGROUND OF THE INVENTION

The invention relates to electronic devices, and, more particularly, to encoders and decoders for turbo codes and methods of coding.

Digital communication systems typically employ a channel coding for the symbols transmitted across a communication channel; the channel coding introduces redundancies to provide for correction of errors introduced by the communication channel. In 1993 Berrou et al introduced "turbo coding" as a type of channel coding with error correction performance close to the theoretical limit. Turbo code are parallel concatenations of recursive systematic (punctured) convolutional coders with random interleaving between the recursive encoders as illustrated schematically in FIG. 2a for the case of two recursive encoders. FIG. 2b shows a corresponding decoder with serial architecture; parallel decoders also exist. Turbo codes apparently achieve their performance with relatively simple component codes and large information blocks with random interleavers. A signal-to-noise ratio of only 0.7 dB could yield a bit error rate (BER) of $10^{-5}$ and could be useful for noisy communication channels. Essentially, the interleaver should be capable of spreading low-weight input sequences so that the resulting codeword has high weight. The interleaver reorders the symbols in a block of K symbols (typically in the range of 100–100,000). Mathematically, the interleaver generates a permutation that maps the set $\{0, 1, 2, 3, \ldots, K-1\}$ onto itself so that the mapping is one-to-one.

In conventional communication systems that require interleaving, the common practice is to apply a block interleaver. A block interleaver can be easily implemented by writing the data into a matrix of dimensions $K_1 \times K_2$ ($K = K_1 K_2$) row by row and then reading the data out column by column.

The actual permutation used in a turbo coding scheme has a crucial effect on the performance of the coding scheme in terms of probability of bit error at a given signal-to-noise ratio. It has been found that a good interleaver for a turbo coding scheme resembles a random permutation. The simple method of using a block interleaver has been proven to be unsatisfactory for turbo coding.

The design of a good interleaver for a turbo coding scheme turned out to be an extremely difficult challenge and has become a topic of an extensive research effort. While no method for designing an "optimal" interleaver has yet been found, most of the published procedures for designing a good interleaver are based on the following principles:

a. Given the size of the data block and other parameters of the turbo coding scheme, design an interleaver by either applying a deterministic procedure or by generating numerous random permutations and picking out the "best" permutation. The choice of the best permutation is made by applying some quality criterion.

b. Store the found interleaver in the transmitter (encoder) and in the receiver (decoder). The interleaver is usually stored as the sequence of the permuted indices. Thus, the required storage memory increases linearly with the block size K.

The foregoing approach for "off-line" construction of an interleaver enables one to generate an interleaver matched to a specific coding scheme by applying one of the suggested procedures. However, this approach implies that memory storage is allocated in both the transmitter and the receiver for storing the computed permutation.

The foregoing approach for "off-line" construction of an interleaver has two shortcomings:

a. Dedicated storage memory is required. This might be a serious problem if the coding scheme operates with a large block.

b. The approach is not applicable for a coding system which is designed to use blocks of variable size. If the number of legitimate block sizes is large, it would be impractical to design and store "off-line" designed interleavers for all allowable block sizes.

Dolinar et al, Weight Distribution of Turbo Codes Using Random and Nonrandom Permutations, JPL TDA Progress Report 42–122 (August 1995) analyzes various interleavers with regard to how effectively data sequences that produce low encoded weight at the output of one encoder are matched with permutations of the same data sequence that yield higher encoded weights at the outputs of the other encoder(s). One of the permutations considered (in detail for the case N=32) was the circular shift $\pi(j)=a*j+r \pmod{N}$ where r<N is an offset and a <N is a step size that is relatively prime to N. Similarly, Takeshita et al, On Deterministic Linear Interleavers for Turbo Codes, 35th Allerton Conference on Communication, Control and Computing (September 1997). Divsalar et al, U.S. Pat. No. 6,023,783 illustrates various Turbo code encoder architectures which incorporate interleavers.

SUMMARY OF THE INVENTION

The present invention provides a permutation generator for constructing interleavers for turbo coding schemes with varying block sizes.

This has advantages including real-time permutation generation with minimal memory requirements.

BRIEF DESCRIPTION OF THE DRAWINGS

The drawings are heuristic for clarity.

FIG. 3 is a parameter table.

DESCRIPTION OF THE PREFERRED EMBODIMENTS

1. Overview

Preferred embodiments provide real-time permutation generators for construction of interleavers in turbo coding schemes which can operate with a data block of variable size. Because the block size can take on many different values (e.g., roughly 100 to 100,000), permutations for all these values cannot be constructed "off-line"; and the preferred embodiments provide a method for generating the permutation whenever it is required. Preferred embodiment transmitters and receivers incorporate the preferred embodiment permutation generators for turbo coding. The main permutation generator features are:

a. The method is applicable to data blocks of any practical size.

b. No memory is required for storing the permutations in the transmitter and the receiver.

c. The method for generating the permutations is very simple and thus does not impose a serious burden on the complexity of the encoder or the decoder.

d. The permutation maps even indices to even indices. This feature is significant for some applications.

The permutation generator relies on a modulo operation with a modulus selected according to block size. In particular, a table relates a parameter to block size, and the permutation is defined as multiplication by the parameter followed by modulo with respect to block size.

2. First Preferred Embodiments Characteristics

Figure 1A:
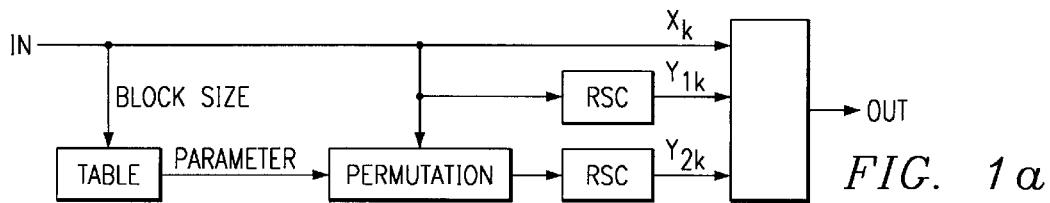
FIGS. 1a–1b illustrate preferred embodiment encoder and decoder.
Figure 1B:
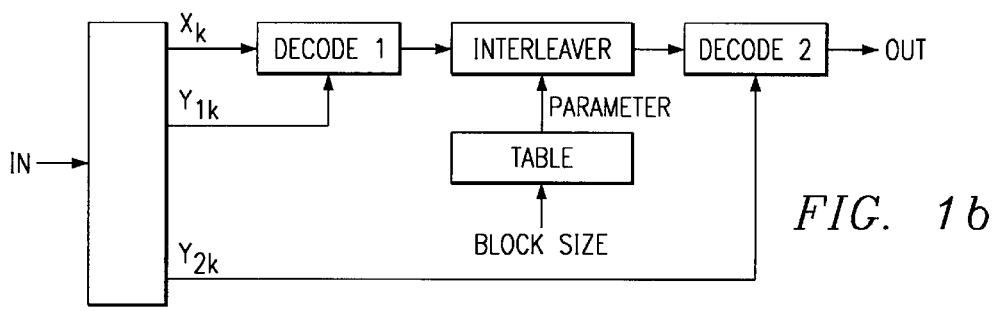
Figure 2A:
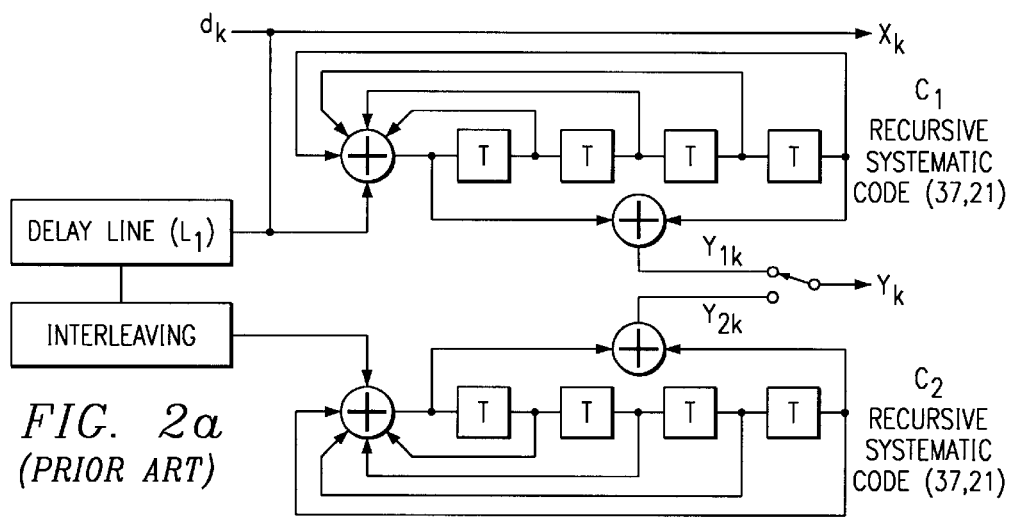
FIGS. 2a–2b show a known turbo encoder and decoder.
Figure 2B:
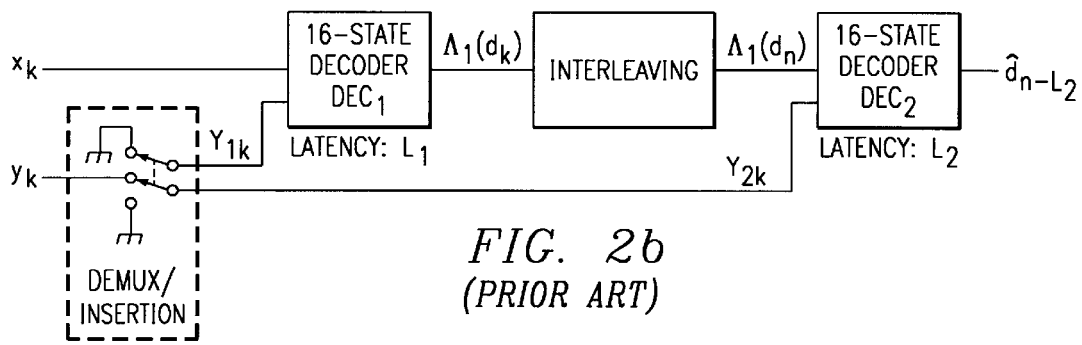

FIG. 1a illustrates a preferred embodiment communications system encoder which sends data in packets whose length (block size) can vary in a very large range; the interleaver uses the block-size-generated permutation. This extends the encoder of FIG. 2a. FIG. 1b shows a preferred embodiment communication system serial decoder; this extends the decoder FIG. 2b, again by use of the block size to determine the interleaver permutation parameter. Other preferred embodiments analogously extend parallel and mixed decoders to use the block size to determine the interleaver permutation parameter.

Denote the length of the packet, in terms of information symbols, by $K_{packet}$. For a binary turbo coding scheme, the information symbols are bits while for a non-binary scheme, such as a turbo-TCM scheme, the information symbols are defined over a non-binary alphabet.

A practical turbo coding system would usually have an upper bound on the size of the packet, $K_{packet}$. This bound, $K_{max}$, might be determined by a constraint on the maximal delay or by a constraint on some system resource, e.g., storage memory. If $K_{packet} > K_{max}$, then the packet will be divided in the transmitter into $N_{packet}$ blocks of size $K_i$ so that $K_{packet} = \Sigma_i K_i$ for $1 \leq i \leq N_{packet}$ and $K_{min} \leq K_i \leq K_{max}$ The values of the sequence lengths $K_i$ should be about equal. The size of the longest and of the shortest sequence should be determined as follows:

$K_{min}$ is the shortest sequence for which it is still worthwhile to apply turbo coding. This sequence can be several hundred symbols long.

$K_{max}$ is the longest sequence admissible.

In the receiver, each of the $N_{packet}$ blocks will be decoded by applying an iterative decoding procedure and the data packet of size $K_{packet}$ will be reconstructed.

Because the performance of the turbo coding scheme improves with increasing the block size, it would be worthwhile to set $K_{max}$ to be as large as possible. Note that large packets will have the best performance since for large packets it would be possible to divide the packet of size $K_{packet}$ so that all $K_i$ are close to $K_{max}$.

The shortest sequence of length $K_{min}$ will be used only when $K_{packet} = K_{min}$. For $K_{packet} > K_{max}$ it would always be possible to divide the packet into sequences of length $K_i$ so that $K_i > K_{min}$, (i=1, 2, . . . , $N_{packet}$) provided that $K_{max} > 2K_{min}$.

The rules for dividing the packet of length $K_{packet}$ into $N_{packet}$ sequences of length $K_i$ should be simple and known to both the transmitter and the receiver.

The task of the permutation generator is to apply a deterministic memoryless procedure that can generate valid permutations that can be used for interleaving a data block of any given size K in the range $K_{min} \leq K_i \leq K_{max}$. The permutation generator calculates for any integer index k the corresponding index $\pi(k)$ in the permuted sequence for $0 \leq k$, $\pi(k) \leq K-1$.

For the permutation generator to be applicable in a turbo coding scheme, the following features are required:

a. For every admissible value of the information sequence size K, the generator should provide a valid permutation; i.e., all indices should be properly mapped.

b. No strict constraints should be imposed on the value of K.

c. The number of parameters of the permutation generator should be small.

d. The computational complexity of the permutation generator should be small.

e. In order to provide good performance when employed in a turbo-coding scheme, the generated permutations for all admissible values of the information sequence K should resemble, as much as possible, a good pseudo-random permutation.

The preferred embodiment permutation generators comply with the foregoing and use only one parameter that is read from a look-up table. The preferred embodiments have the further feature that $\pi(.)$ maps even indices into even indices.

3. Implementation

The preferred embodiment permutation generators proceed with the following steps for a given block size K:

(a) Use the table of FIG. 3 to pick the appropriate value of the parameter $\alpha_K$ depending on the value of K.

(b) If K is a multiple of $\alpha_K$, then replace K by K+2.

(c) Define the permutation $\pi$ as: $\pi(k) = \alpha_K * k \pmod{K}$ for $0 \leq k \leq K-1$.

In every range of values of K in FIG. 3 there are a few values for which K is a multiple of $\alpha_K$ in step b. For example, the values of K in the range $1526 \leq K \leq 1765$ we have $\alpha_K = 41$ and thus obtain K as a multiple of $\alpha_K$ for six K values: 1558, 1599, 1640, 1681, 1722, and 1763. In other ranges in FIG. 3, the number of values for which K is a multiple of $\alpha_K$ is likewise small. In many practical systems, there would be a constraint that K is an even integer or even that K is a multiple of 8. In the above range, there are only three K values which are both even and a multiple of $\alpha_K$ and only one (K=1640) which is both a multiple of 8 and a multiple of $\alpha_K$.

4. Alternative Preferred Embodiments

Alternative preferred embodiments follow foregoing steps (a) and (c) of the first preferred embodiments but substitute the following step (b') for the foregoing step (b) which replaces K by K+2 in the case K is a multiple of $\alpha_K$:

(b') If K is a multiple of $\alpha_K$, then use the $\alpha_K$ from the preceding range of K values in the table of FIG. 3.

For example, if K=1640, then step (a) gives $\alpha_K = 41$ and previous step (b) would have incremented K to 1642. However, step (b') just repicks $\alpha_K = 37$ and proceeds to step (c). Lastly, for K in the range $144 \leq K \leq 229$, use $\alpha_K = 11$.

Note that $\alpha_K \approx \sqrt{K}$ and is prime and that the product of two successive $\alpha_K$s as used in steps (a)–(b') is smaller than the K range endpoint of the second $\alpha_K$. Thus step (b') always provides a usable $\alpha_K$. Indeed, the list of $\alpha_K$s of the table of FIG. 3 is just a listing of the primes (except for 89) from 13 to 257, and the ranges for K are roughly just the ranges between corresponding products of two successive $\alpha_K$s. For example, $\alpha_K = 41$ corresponds to the range $1526 \leq K \leq 1765$ where $1526 = 41*37+9$ and $1765 = 43*41+2$.

Of course, another table can be generated using another sequence of pairwise-relatively prime $\alpha_K$s together with K range endpoints equal to products of two successive $\alpha_K$s+a small number. Of course, the $\alpha_K$ has to be relatively prime to its Ks for the modulo permutation to be one-to-one.

For the table of FIG. 3, $K_{min}$ equals 144 and $K_{max}$ equals $2^{16}$ (=65,536). This very large range of block sizes should be sufficient for covering all practical applications of turbo coding. This spread of K values is divided into 50 ranges with each range having an $\alpha_K$ value.

In an actual implemented system only a portion of the table of FIG. 3 (determined by the actual values of $K_{min}$ and $K_{max}$) would be required so there is no need to store the entire table in the transmitter and in the receiver. Furthermore, the size of the stored table can be further reduced in size by merging two adjacent K ranges into a single K range and using the larger of the two $\alpha_K$s as the $\alpha_K$ for the merged K range. This merger should have a very small effect on performance, especially when the values of the $\alpha_K$s are close.

Note that the multiplication operation in step (c) is multiplication by a constant value of $\alpha_K$. A multiplication by a constant is simpler to implement than multiplication of two integer variables. The multiplication can be avoided by applying the following observation: In an implemented system, one usually computes permutations of successive values of k. Thus, when $\pi(k)$ is known, the value of $\pi(k+1)$ can be obtained by using a recursion:

$$\pi(k+1) = \begin{cases} \pi(k) + \alpha_K & \text{for } \pi(k) + \alpha_K < K \\ \pi(k) + \alpha_K - K & \text{for } \pi(k) + \alpha_K \geq K \end{cases}$$

Also the modulo operation in step (c) does not require a division operation. It can be easily implemented by a counter.

6. Modifications

The preferred embodiments can be modified in various ways while retaining the features of a parametric permutation generator for interleaving in turbo codes. For example, the number of recursive convolution codes used could be increased with a separate interleaver for each further code. The block size could be beyond those listed in FIG. 3. The ranges of block size could roughly track products of three successive primes and step (b)' of the preferred embodiment iterated to find a suitable parameter value. A subset of the primes could be used to generate the segments and parameters.

What is claimed is:

1. A system for encoding, comprising:

(a) a first convolution encoder with an input coupled to a data input;

(b) an interleaver system coupled to said data input; and (c) a second convolution encoder with an input coupled to said interleaver system;

(d) wherein said interleaver system includes data block size detection and data permutation with permutation parameter derived from a lookup table of data block sizes.

2. The system of claim 1, wherein:

(a) said lookup table permutation parameters are prime numbers; and (b) said permutation of data bit position within a data block is modulo multiplication by a corresponding one of said permutation parameters.

3. A system for decoding, comprising:

(a) a demultiplexer coupled to a encoded data input, said demultiplexer separating first and second convolution-encoded bits;

(b) a first decoder coupled to said demultiplexer, said first decoder for said first convolution encoded bits;

(c) an interleaver system coupled to output of said first decoder, said interleaver system using permutations dependent upon permutation parameters from a lookup table of input data block sizes; and (d) a second decoder coupled to said demultiplexer, said second decoder for said second convolution encoded bits, said second decoder also coupled to said interleaver;

(d) wherein decoded data estimates from said first decoder are used by said second decoder.

4. A method of coding, comprising:

(a) encoding input data with a first convolution coder;

(b) interleaving said input data; and (c) encoding said interleaved input data;

(d) wherein said interleaving uses permutation parameters dependent upon input data block size.

* * * * *